United States Patent
Yamana (10) Patent No.: US 6,544,903 B2
(45) Date of Patent: Apr. 8, 2003

(54) RESIST PATTERN FORMING METHOD AND SEMICONDUCTOR DEVICE MANUFACTURING METHOD

(75) Inventor: Mitsuhara Yamana, Tokyo (JP)

(73) Assignee: NEC Corporation, Tokyo (JP)

( * ) Notice: Subject to any disclaimer, the term of this patent is extended or adjusted under 35 U.S.C. 154(b) by 28 days.

(21) Appl. No.: 09/826,006

(22) Filed: Apr. 5, 2001

(65) Prior Publication Data

US 2001/0029107 A1 Oct. 11, 2001

(30) Foreign Application Priority Data

Apr. 5, 2000 (JP) .................................... 2000-103368

(51) Int. Cl.[7] ........................................... H01L 21/469
(52) U.S. Cl. ...................... 438/781; 438/780; 430/313; 430/314
(58) Field of Search ................................. 430/311, 312, 430/313, 314; 438/758, 780, 781, 784

(56) References Cited

U.S. PATENT DOCUMENTS 6,316,169 B1 * 11/2001 Vahedi et al. ................ 216/37

* cited by examiner

Primary Examiner—Kamand Cuneo
Assistant Examiner—Lisa Kilday
(74) Attorney, Agent, or Firm—Young & Thompson

(57) ABSTRACT

The whole surface of a resist pattern having a line width greater than a desired line width is exposed with an exposure amount equal to the amount for penetrating through the resist pattern or less. After heat treatment, a developer soluble portion is dissolved and removed by development for 5 seconds to obtain a resist pattern having a desired line width.

8 Claims, 8 Drawing Sheets

RESIST PATTERN FORMING METHOD AND SEMICONDUCTOR DEVICE MANUFACTURING METHOD

BACKGROUND OF THE INVENTION

1. Field of the Invention

The present invention relates to a resist pattern forming method in a lithography technique and a semiconductor device manufacturing method using the same.

2. Description of the Related Art

In general, a technique for forming a pattern based on a circuit design is referred to as lithography technique in a semiconductor manufacturing process. Requirements of the lithography technique in the semiconductor manufacturing process include resolution (minimum line width which can be formed on a substrate), focal depth (range in which a clear image can be obtained in the back and front of the focal surface), alignment precision, etching resistance, throughput and low costs.

As well known, a short-wavelength light source is used, the NA (Numerical Aperture) of a projecting lens is increased or the like as a method for improving resolution. However, since the increase of the NA value reduces the focal depth, the NA value needs to be set such that a practical focal depth can be ensured.

The basic procedure of the lithography technique comprises the steps of coating a substrate with a resist (resist coating), exposing the resist in a pattern corresponding to a circuit design (exposure) and developing the exposed resist to form a resist pattern on the substrate (development). A conventional resist pattern forming method will be described below with reference to FIGS. 1A–1D.

FIGS. 1A–1D are sectional process drawings of a conventional resist pattern forming method (conventional example 1).

A resist pattern having a line width of 110 nm is formed by this conventional resist pattern forming method.

Figure 1A:
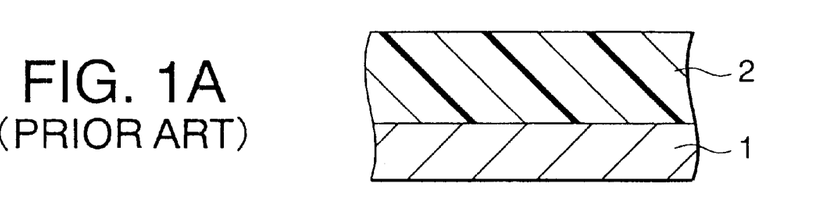
FIGS. 1A–1D are sectional process drawings of a conventional resist pattern forming method (conventional example 1)

First, a substrate 1 is coated with a resist 2 having a film thickness of 500 nm (FIG. 1A). This is a positive resist.

Figure 1B:
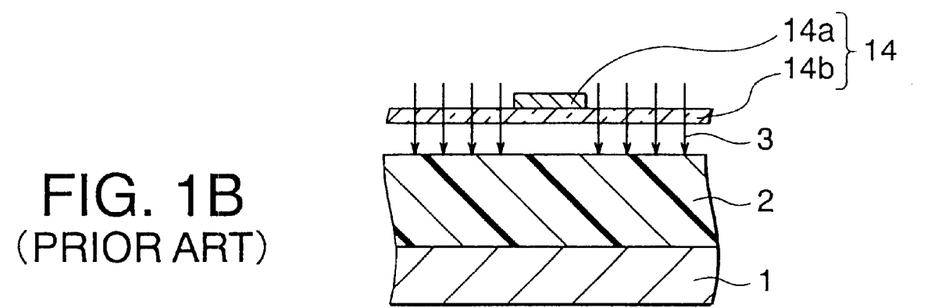

Subsequently, the resist 2 is irradiated with KrF light 3 by a stepper (not shown; a kind of aligner) through a photomask 14 to expose a mask pattern (FIG. 1B). At this time, the optical conditions are a numerical aperture NA of 0.68 and a coherence factor σ of 0.75. The wavelength of the KrF light is 248 nm. The exposure amount is 35.0 mJ/cm². By this exposure, an acid generating agent is photodecomposed in an exposed portion of the resist 2, thereby generating an acid. As a photomask 14, a mask obtained by forming a metallic thin film 14a having an aperture pattern on a glass substrate 14b is used.

Figure 1C:
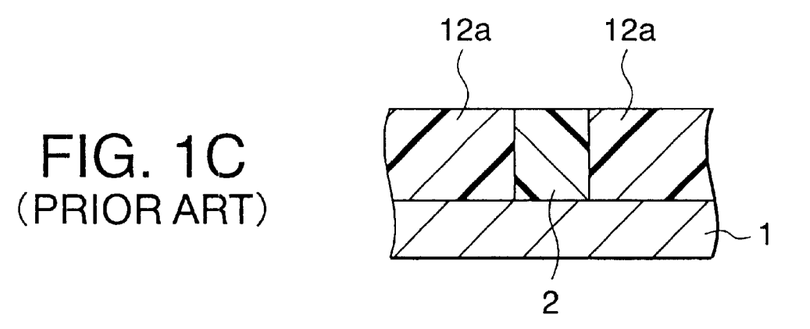

Subsequently, heat treatment is performed at 105° C. for 90 seconds (FIG. 1C). By this heat treatment, a protective group in the exposed portion of the resist 2 is reacted by the acid catalyst elimination reaction, thereby increasing hydrophilicity of the exposed portion of the resist 2. As a result, a developer soluble portion 12a which can be dissolved by a developer is formed.

Figure 1D:
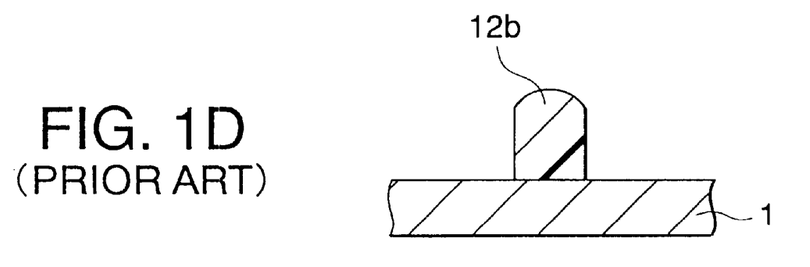

Then, development is performed by using a TMAH (Tetramethyl Ammonium Hydroxide) aqueous solution having a concentration of 2.38% at a liquid temperature of 23° C. for a development time of 60 seconds (FIG. 1D). By this development, the developer soluble portion 12a is dissolved and removed and an unexposed portion remains. Thus, a resist pattern 12b having a line width of 110 nm is obtained.

Subsequently, when the above-described mask pattern is exposed with KrF light by using a lens having an NA of 0.68 and a σ of 0.75, an experiment shown in the above FIGS. 1A–1D is carried out as described above by moving a wafer stage of the aligner relatively to the lens to check the focal depth with which a developed resist pattern having a line width design dimension of 110 nm±10% can be obtained.

Figure 2:
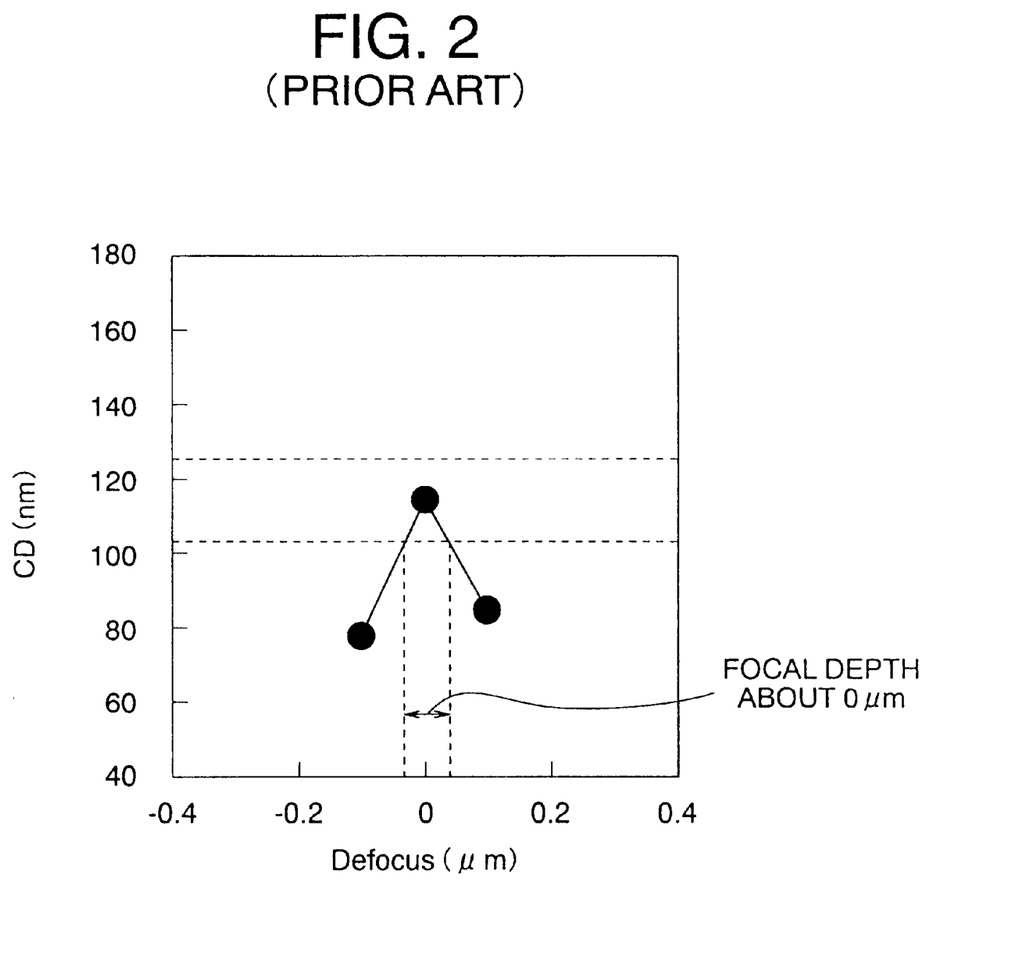
FIG. 2 shows a CD (critical dimension)-Focus curve in the resist pattern forming methods of conventional examples 1 and 2.

As a result, a CD (critical dimension)-Focus curve shown in FIG. 2 is obtained. Two broken lines in parallel to the horizontal axis shown in FIG. 2 are lines each showing a line width of 110 nm±10%. As shown in FIG. 2, in this optical system, a focal depth with which a line having a design dimension of 110 nm can be formed with an error of 10% is very shallow and substantially 0 μm. The above optical system currently has the most advanced resolution in practice. However, the result of the above-described experiment showed that almost no focal depth could be obtained even though this system is used.

In the above conventional example 1, a case where a resist pattern is formed on a wafer having a planar surface across the whole is assumed. Normally, however, steps are present in some regions on the surface in an actual semiconductor device. Such an example will be described below.

FIGS. 3A–3D are sectional process drawings of another conventional resist pattern forming method (conventional example 2). A substrate 11 has a step of 0.2 μm in FIGS. 3A–3D. During a semiconductor manufacturing process, steps of this size are spontaneously generated by a circuit pattern laminated on a semiconductor wafer. The method of conventional example 2 is employed on this substrate 11 under the same conditions as in the above conventional example 1. In conventional example 2 as well, a resist pattern having a line width of 110 nm is formed.

In conventional example 2, the substrate 11 is first coated with a resist 2 having a film thickness of 500 nm (FIG. 3A) as in the case of conventional example 1.

Figure 3A:
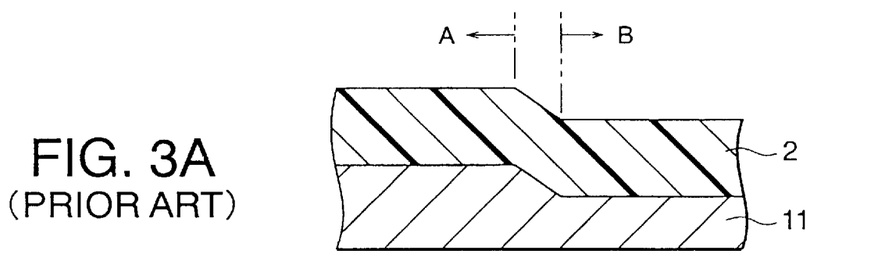
FIGS. 3A–3D are sectional process drawings of another conventional resist pattern forming method (conventional example 2)
Figure 3B:
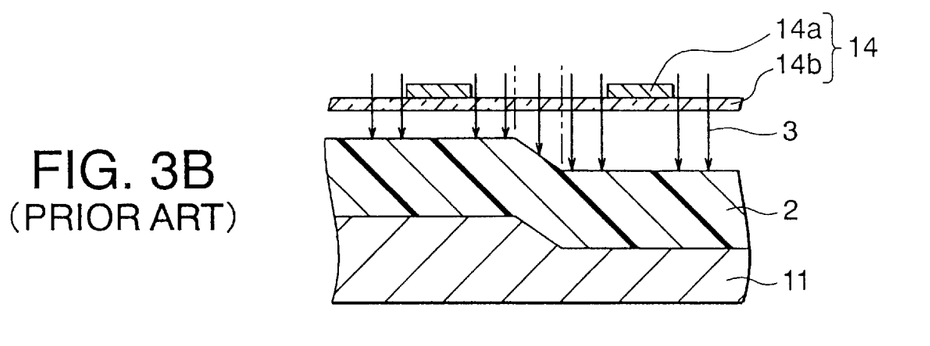

Subsequently, the resist 2 is irradiated with KrF light 3 by a stepper (not shown) through a photomask 14 to expose a mask pattern (FIG. 3B). At this time, the focus is adjusted to the upper level portion A of the step. Therefore, since the focal depth is even less than 0.1 μm as described above, a pattern having designed dimensions can not be obtained on the lower level portion B of the step.

Figure 3C:
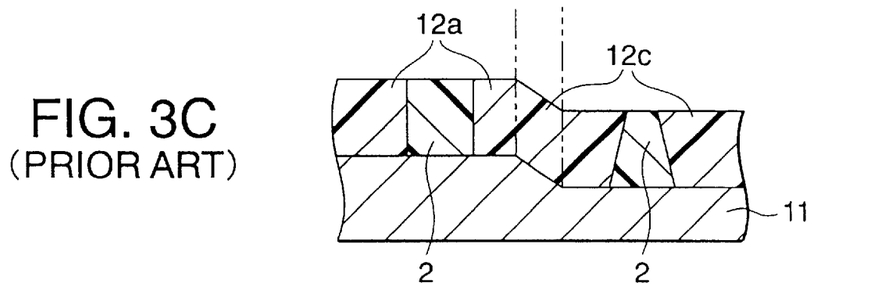

Subsequently, heat treatment is performed at a temperature of 105° C. for 90 seconds (FIG. 3C).

Figure 3D:
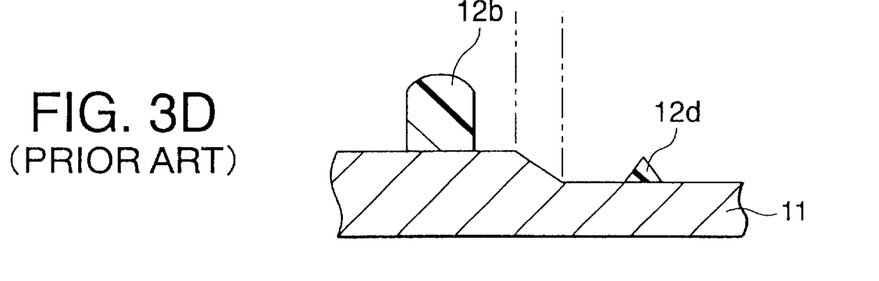

Then, development is performed by using a TMAH aqueous solution having a concentration of 2.38% at a liquid temperature of 23° C. for a development time of 60 seconds (FIG. 3D). By this development, a developer soluble portion 12a is dissolved and removed and an unexposed portion remains. Thus, a resist pattern 12b having a line width of 110 nm is obtained on the upper level portion A of the step. On the other hand, since the lower level portion B is not within the focal depth in the exposure, the pattern precision is degraded. After the developer soluble portion 12c is dissolved and removed, a resist pattern having a line width of 110 nm cannot be obtained. A resist pattern 12d having a deformed pattern remains.

As described above, in conventional resist pattern forming methods, when a resist pattern having the same line width as the resolution of the aligner is to be formed, a sufficiently practical focal depth cannot be obtained, thereby resulting in difficulty to form a resist pattern having a desired line width. Therefore, these methods are not practical.

SUMMARY OF THE INVENTION

Accordingly, an object of the present invention is to provide a resist pattern forming method by which a resist pattern having a finer line width can be formed in high precision with a sufficiently practical focal depth than a line width with which a sufficient focal depth can be conventionally obtained so that contradicting problems between the resolution and the focal depth are solved.

A resist pattern forming method according to a first aspect of the present invention has the steps of forming a resist pattern having a line width greater than a desired line width by exposure and development, and reducing the line width by exposing the whole surface of said resist pattern and developing the resist pattern.

According to the resist pattern forming method of this aspect of the present invention, a resist pattern having a line width greater than a desired line width has only to be exposed in a process of exposing a resist pattern. Therefore, practical resolution can be ensured even with a finer line width than a line width with which a sufficient focal depth can be obtained.

That is, an advantage is that a desired resist pattern finer than a line width with which a sufficient focal depth can be obtained can be formed in high precision on not only a planar substrate, but also a substrate with some irregularities.

It is noted that a positive resist is used in the present invention. Exposure of the whole surface herein indicates that an optical path from a light source to a resist is not blocked with a mask or the like so that the whole surface of the resist is exposed.

A resist pattern forming method according to a second aspect of the present invention has the steps of forming a resist pattern having a line width greater than a desired line width by exposure and development, and reducing the line width of said resist pattern by exposing the whole surface of the resist pattern with an exposure amount equal to the amount for penetrating through the resist pattern or less and developing.

According to the resist pattern forming method of this aspect, the same advantage as that of the resist pattern forming method of the first aspect of the invention can be obtained. In addition, since the whole surface of a resist pattern having a line width greater than a desired line width is exposed with an exposure amount equal to the amount for penetrating through the resist pattern or less, the whole resist pattern is not dissolved by the subsequent development. Therefore, too much reduction to a line width finer than a desired line width can be prevented and a resist pattern having a desired line width can be easily and reliably formed. However, it is preferable that optimal values of the exposure amount for exposure of the whole surface and the development time thereafter are obtained by an experiment or the like and set in advance to obtain an appropriate amount of reduction to form a resist pattern having a desired line width.

A resist pattern forming method according to a third aspect of the present invention has the steps of forming a resist pattern having a line width greater than a desired line width by exposure and development, and reducing the line width by exposing the whole surface thereof and developing the resist pattern for a development time shorter than the development time in the aforementioned development.

According to the resist pattern forming method of this aspect, the same advantage as in the resist pattern forming method of the first aspect of the invention can be obtained. In addition, since a resist pattern having a line width greater than a desired line width is developed for a develop time shorter than the development time in the development for forming the resist pattern having a line width greater than a desired line width, a resist pattern having a desired line width can be formed by reducing the resist pattern. However, it is preferable that optimal values of the exposure amount for exposure of the whole surface and the development time thereafter are obtained by an experiment or the like and set in advance to obtain an appropriate amount of reduction to form a resist pattern having a desired line width.

A semiconductor device manufacturing method according to a fourth aspect of the present invention for forming a pattern having a desired width on a semiconductor wafer has the steps of coating the whole surface thereof with a resist, thereafter performing exposure with a mask pattern having a width greater than the desired width, thereafter developing the resist to form a first pattern, thereafter exposing the whole surface of the first pattern and performing development to form a second pattern having the desired width and processing material under the coating by using the second pattern.

A semiconductor device manufacturing method according to a fifth aspect of the present invention is characterized in that the semiconductor wafer has a step and the width of the mask pattern is a width with which a sufficient focal depth can be obtained to form the first pattern irrespective of the position of the exposure on the semiconductor wafer in the semiconductor device manufacturing method of the fourth aspect of the invention.

A semiconductor device manufacturing method according to a sixth aspect of the present invention is characterized in that the exposure amount for the exposure of the whole surface is an exposure amount equal to the amount for penetrating through a film of the first pattern or less in the semiconductor device manufacturing method of the fourth or fifth aspect of the invention.

A resist pattern forming method according to a seventh of the present invention comprises the steps of:

coating a substrate with a positive resist;

conducting a first exposure of a pattern to the resist with an exposure amount equal to the amount for penetrating through the resist pattern or more;

conducting a first heat treatment for making an exposed portion of the resist soluble;

conducting a first development for dissolving and removing the soluble portion of the resist to form a resist pattern;

conducting a second exposure for exposing the whole surface of the resist pattern with an exposure amount equal to the amount for penetrating through the resist pattern or less;

conducting a second heat treatment for making the exposed portion of the resist pattern soluble; and conducting a second development for dissolving and removing the soluble portion of the resist pattern.

According to the resist pattern forming method of this aspect of the invention, first, a resist pattern is formed by the resist coating process, first exposure process, first heat treatment process, and first development process for forming a resist pattern. Then, in the second exposure process, the whole surface of the resist pattern is exposed with an exposure amount equal to the amount for penetrating through the resist pattern or less. Therefore, the whole resist pattern is not dissolved by the subsequent second development process. In the second development process, the portion of the resist pattern made soluble is dissolved and removed. Thus, the line width of the resist pattern can be reduced.

Therefore, a fine desired resist pattern having a line width equal to resolution of an aligner or smaller can be formed in high precision by setting processing conditions such that the reduced resist pattern has a desired line width corresponding to a circuit design and utilizing the resist pattern forming method of the seventh aspect of the invention.

DETAILED DESCRIPTION OF THE PREFERRED EMBODIMENT

A resist pattern forming method and a semiconductor device manufacturing method according to embodiments of the present invention will be described in detail below with reference to the accompanying drawings.

A resist pattern forming method according to a first embodiment of the invention will be described below with reference to FIGS. 4A–4G. FIGS. 4A–4G are sectional process drawings of the resist pattern forming method according to the first embodiment of the invention. The embodiment described below is one embodiment of the present invention and does not limit the scope of the invention.

In the resist pattern forming method according to the first embodiment of the invention described below, a resist pattern having a line width of a (nm) is formed. The width a (nm) is a line width finer than a line width with which a sufficient focal depth can be obtained. The line width a is, for example, 110 nm. An aligner is not particularly limited, but a currently commercialized aligner using a KrF excimer laser ($\lambda$=248 nm) as a light source can be used. Furthermore, when an aligner which has the most advanced resolution such as an aligner using a short-wavelength ArF excimer laser ($\lambda$=193 nm) as a light source or the like is used, the most advanced fine processing is further enabled by the present invention.

Figure 4A:
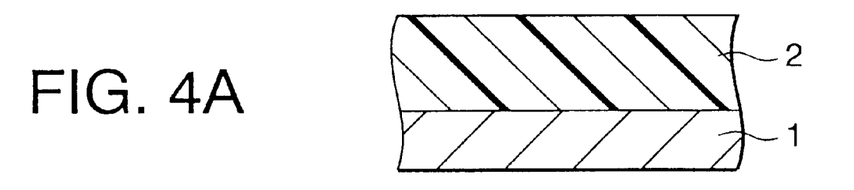
FIGS. 4A–4G are sectional process drawings of a resist pattern forming method according to a first embodiment of the present invention.

In this embodiment, a substrate 1 is first coated with a resist 2 having a film thickness of, for example, 500 nm (FIG. 4A). A positive resist is used as a resist 2. The present invention cannot be carried out by using a negative resist. The types of a decomposition reaction of a positive resist can be classified into a polarity changing type and a main chain cutting type. When the present invention is carried out, a positive resist of either type may be used. In this embodiment, for example, a polarity changing type positive resist is used.

Figure 4B:
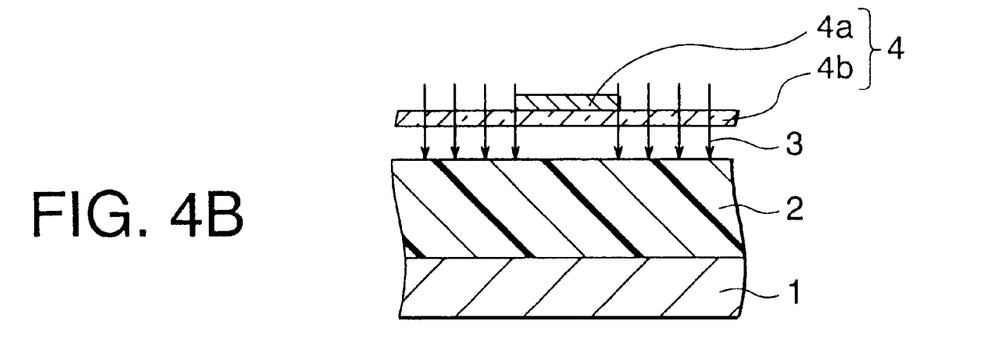

Subsequently, the resist 2 is irradiated with, for example, KrF light 3 through a photomask 4 by a stepper (not shown; a kind of aligner) to expose a mask pattern (FIG. 4B). A photodecomposition reaction is caused by this exposure. That is, an acid generating agent is photodecomposed in the exposed portion of the resist 2, thereby generating an acid. The optical conditions at this time are, for example, the numerical aperture NA is 0.68 and the coherence factors is 0.75. The wavelength of the KrF light 3 is 248 nm. The exposure amount is, for example, 35.0 mJ/cm$^2$. As a photomask 4, a mask obtained by forming a metallic thin film 4a having an aperture pattern on a glass substrate 4b is used. In this case, the width of a light shielding portion 4a of the photomask 4 is c (nm), which is a value greater than a desired design dimension a (nm).

In the above exposure, the exposure amount needs to be greater than the amount for penetrating through the resist pattern. If the exposure amount is equal to the amount for penetrating through the resist pattern or less, a resist pattern cannot be formed.

Figure 4C:
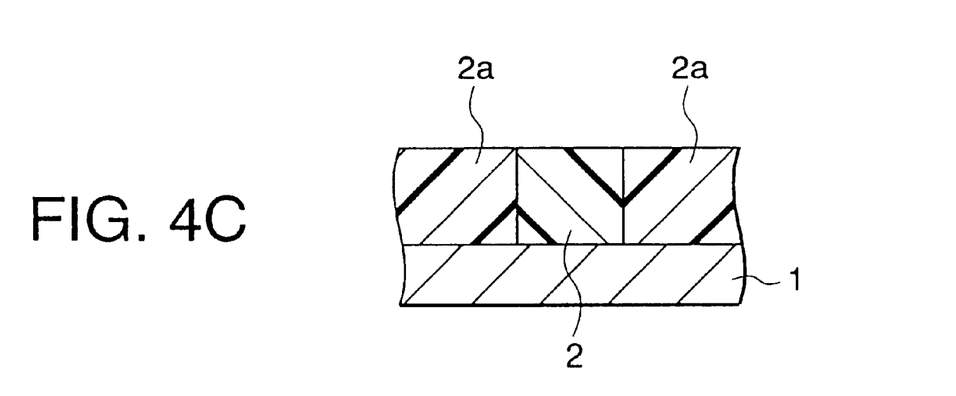

Subsequently, heat treatment is performed, for example, at 105° C. for 90 seconds (FIG. 4C). By this heat treatment, a protective group in the exposed portion of the resist 2 is reacted by the acid catalyst elimination reaction, thereby increasing hydrophilicity of the exposed portion of the resist 2. As a result, a developer soluble portion 2a which can be dissolved by a developer is formed.

Figure 4D:
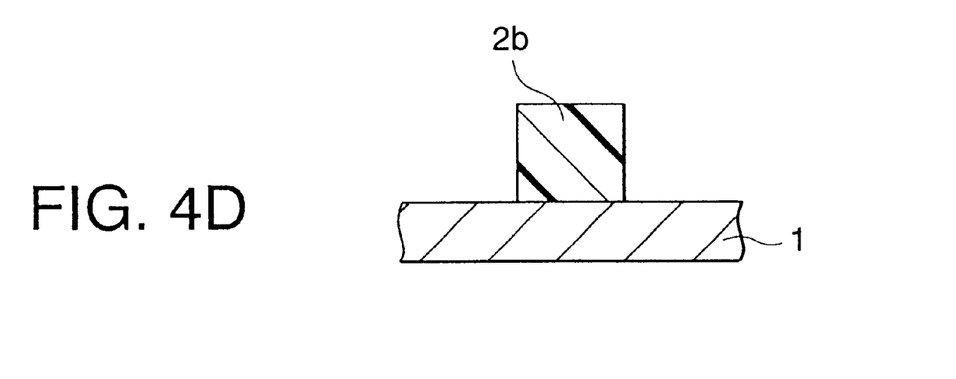

Then, a TMAH aqueous solution having a concentration of, for example, 2.38% is used to perform development for a development time of b seconds (FIG. 4D). In this case, the development conditions are, for example, a liquid temperature is 23° C. and a development time is 60 seconds. By this development, the developer soluble portion 2a is dissolved and removed and an unexposed portion remains. Thus, a resist pattern 2b having a line width of c (nm) is obtained. This line width c (nm) is, for example, 130 nm, which is a value greater than the aforementioned a (nm). This resist pattern 2b having a line width of 130 nm has a rectangular section with favorable precision as compared with the resist pattern 12b having a line width of 110 nm in conventional example 1.

Figure 4E:
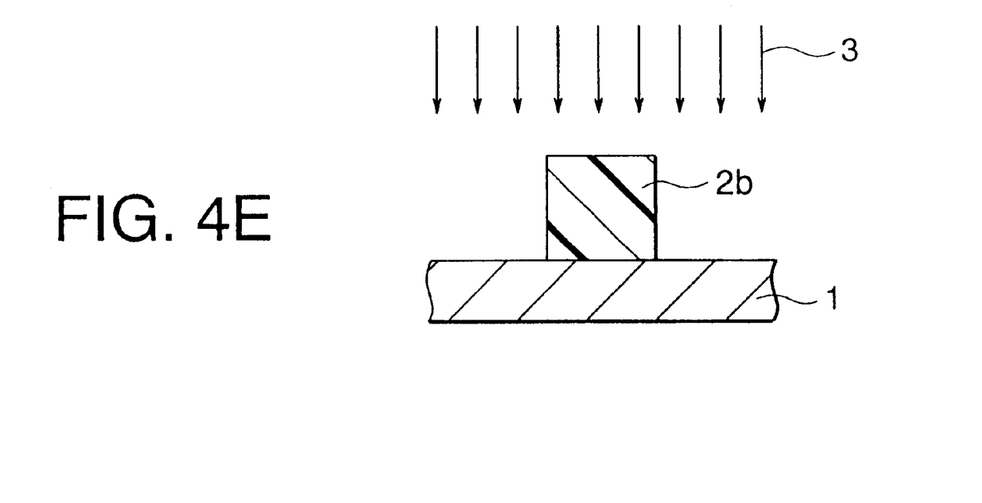

Subsequently, the resist pattern 2b is irradiated with, for example, KrF light 3 by the stepper (not shown) again to expose the whole surface (FIG. 4E). In this case, the exposure amount is equal to the amount for penetrating through the resist pattern or less. The optical conditions at this time are, for example, the numerical aperture NA is 0.68 and the coherence factors is 0.75. Since the amount for penetrating through the resist pattern is, for example, about 15.0 mJ/cm$^2$, the exposure amount is 12.0 mJ/cm$^2$, which is less than the amount for penetrating through the resist pattern. A photodecomposition reaction is caused by this exposure. That is, an acid generating agent is photodecomposed in the exposed portion of the resist pattern 2b, thereby generating an acid.

Figure 4F:
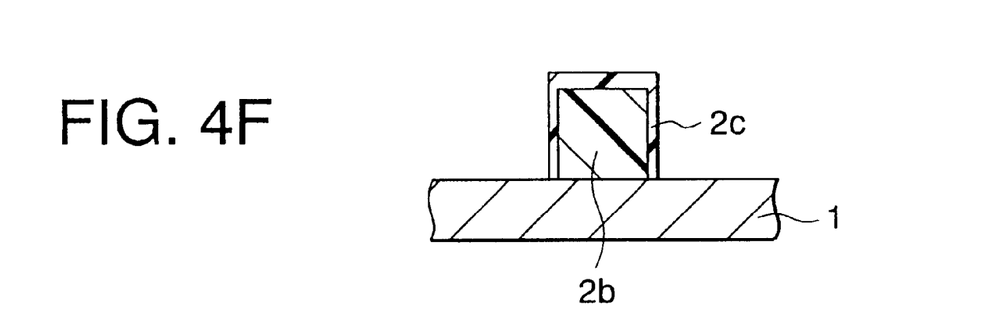

Subsequently, heat treatment is performed (FIG. 4F). The conditions of this heat treatment are, for example, the temperature is 105° C. and the treatment time is 90 seconds. By this heat treatment, a protective group in the exposed portion of the resist pattern 2b is reacted by the acid catalyst elimination reaction, thereby increasing hydrophilicity of the exposed portion of the resist pattern 2b. As a result, a developer soluble portion 2c which can be dissolved by a developer is formed.

Figure 4G:
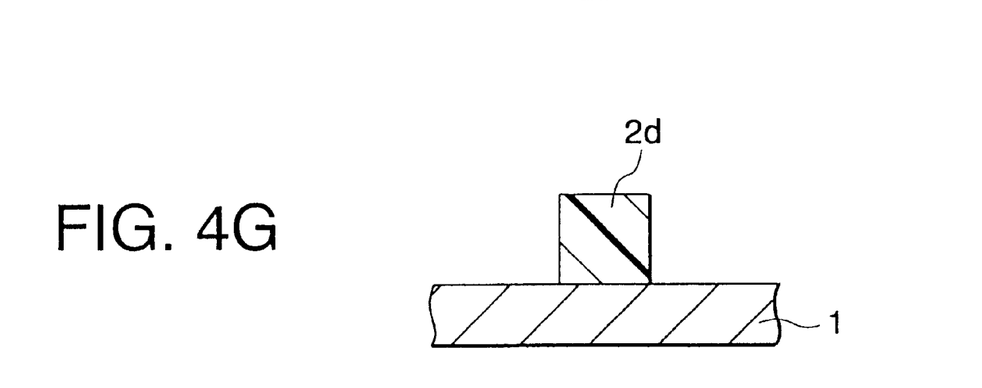

Then, development is performed with a developer such as an organic alkaline aqueous solution or the like for a development time of d seconds (FIG. 4G). This d (seconds) is a value smaller than the aforementioned b (seconds). The organic alkaline aqueous solution is a TMAH aqueous solution having a concentration of, for example, 2.38%. The development conditions are, for example, the liquid temperature of 23° C. and the development time is 5 seconds. By this development, the developer soluble portion 2c is dissolved and removed and an unexposed portion remains. Thus, a resist pattern 2d having a line width of a (nm) is obtained. That is, the line width of the resist pattern 2b having a line width of c (nm) is reduced and thus a resist pattern 2d having a line width of a (nm) is obtained. Therefore, the thickness of the developer soluble portion 2c on the side of the resist pattern 2b is (c−a)/2 (nm).

In this embodiment, firstly, a resist pattern 2b having a line width of, for example, 130 nm is obtained. Then, the resist pattern 2d having a line width of 110 nm is obtained by reducing the width of the resist pattern 2b. Therefore, resist pattern 2d having a line width of 110 nm has a rectangular section with favorable precision as compared with the resist pattern 12b having a line width of 110 nm in conventional example 1.

As described above, since the whole surface is exposed with an exposure amount equal to the amount for penetrating through the resist pattern or less in this embodiment, the whole resist pattern 2b is not dissolved by the subsequent development. Then, a resist pattern 2d having a desired line width can be formed by development for a relatively short time, d seconds (for example, 5 seconds).

In this embodiment, a practical focal depth can also be obtained. Since a sufficient focal depth can be obtained with a line width of c nm (for example, 130 nm), the focal depth is not degraded even when the line width is reduced to a nm (for example, 110 nm) by the method of the present invention.

Furthermore, in this embodiment, a mask dimension c is set so that practically sufficient focal depth can be obtained when a resist pattern 2b having a line width of c is formed.

Figure 5:
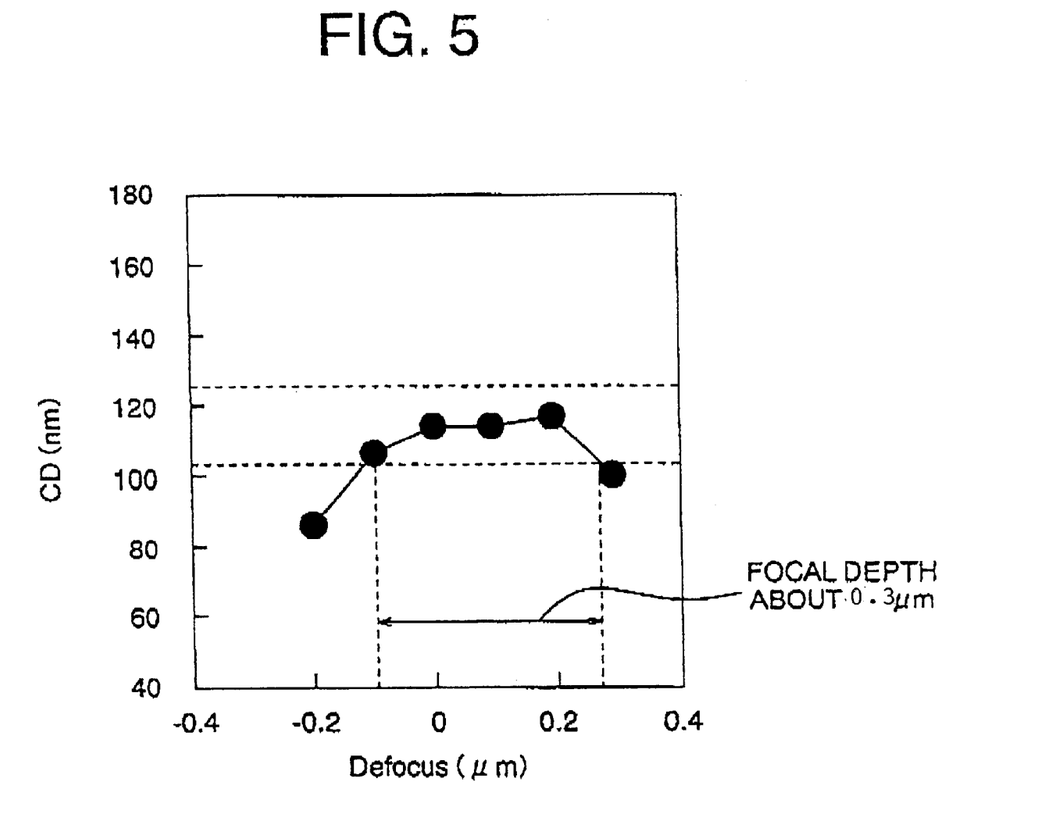
FIG. 5 shows a CD (critical dimension)-Focus curve in the resist pattern forming methods of the present invention.

FIG. 5 shows a CD (critical dimension)-Focus curve according to the resist pattern forming method of the present invention. As shown in FIG. 5, about 0.3 $\mu$m, which is a practical focal depth, can be obtained as the focal depth of this embodiment. Since a sufficient focal depth can be obtained with a pattern having a line width of 130 nm, a practical focal depth can be obtained even when the line width of the pattern is reduced to 110 nm by this method. The focal depth is evaluated by the distance in the back and front of a focus with which a resist pattern having a line width in a range of 110 nm±10% is obtained.

In the present invention, since about 0.3 $\mu$m is secured as the focal depth, application such as an embodiment described below is possible.

A second embodiment of the present invention will be described below with reference to FIGS. 6A–6G. FIGS. 6A–6G are sectional process drawings of a resist pattern forming method according to the second embodiment of the invention.

In the resist pattern forming method of this embodiment as well, a resist pattern having a line width of, for example, 110 nm is formed.

The resist pattern forming method of this embodiment is an embodiment where the present invention is applied to a substrate with a step. In FIGS. 6A–6G, a substrate 11 has a step of, for example, 0.2 $\mu$m. During a semiconductor manufacturing process, steps of this size are spontaneously generated by a circuit pattern laminated on a semiconductor wafer. In this embodiment, a resist pattern is formed on the substrate 11 under the same conditions as in the above first embodiment.

In this embodiment, the substrate 11 is first coated with a resist 2 having a film thickness of 500 nm (FIG. 6A) as in the case of the fist embodiment of the invention.

Figure 6A:
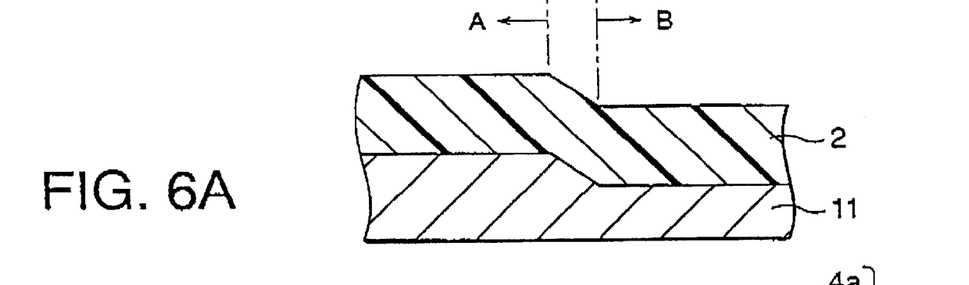
FIGS. 6A–6G are sectional process drawings of a resist pattern forming method according to a second embodiment of the invention.
Figure 6B:
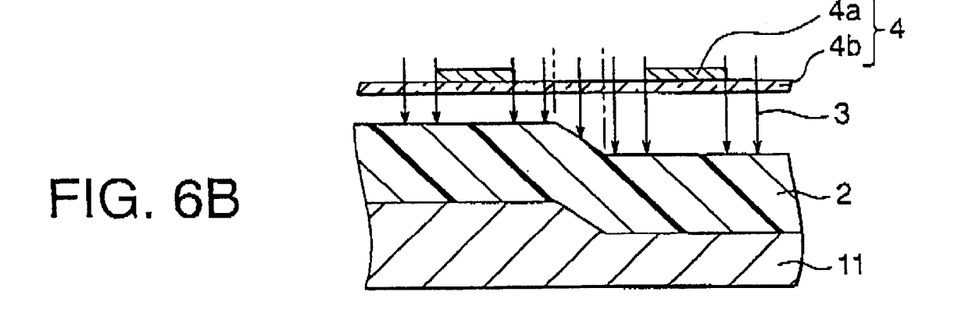

Subsequently, the resist 2 is irradiated with, for example, KrF light 3 by a stepper (not shown) through a photomask 4 to expose a mask pattern (FIG. 6B). At this time, the focus is adjusted to a height of a midpoint of the upper level portion A and the lower level portion B of the step. Therefore, since the focal depth is about 0.3 $\mu$m as described above, both the upper level portion A and the lower level portion B of the step are within the focal depth and thereby a clear exposure latent image can be obtained.

Figure 6C:
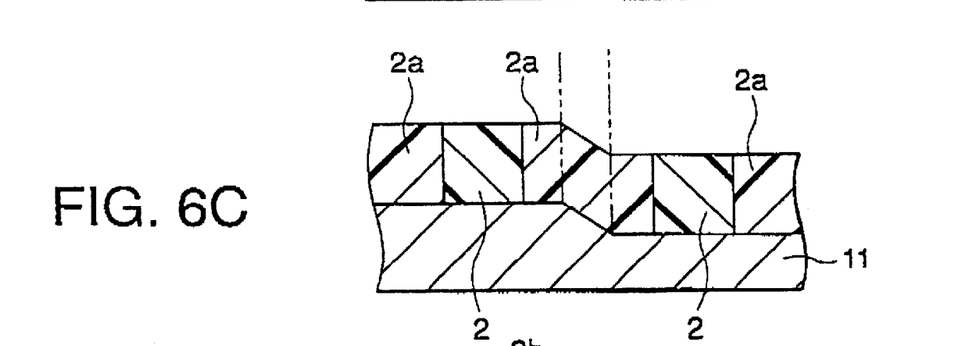

Subsequently, heat treatment is performed, for example, at 105° C. for 90 seconds (FIG. 6C).

Figure 6D:
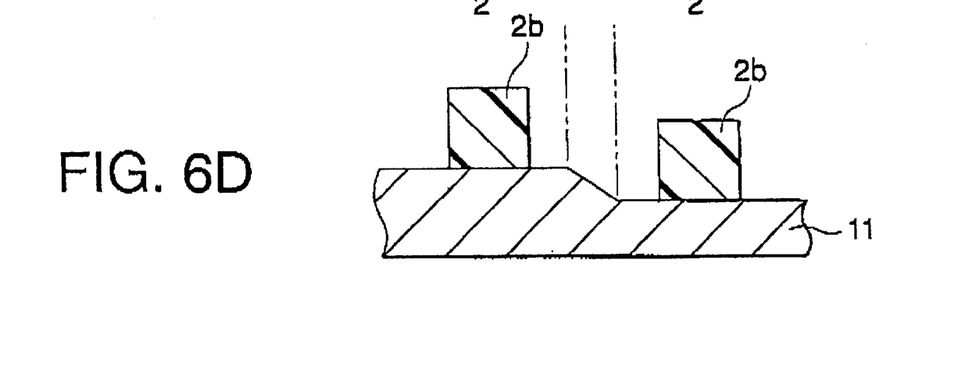

Then, development is performed by using a TMAH aqueous solution having a concentration of, for example, 2.38% at a liquid temperature of 23° C. for a development time of 60 seconds (FIG. 6D). By this development, a developer soluble portion 2a is dissolved and removed and an unexposed portion remains in both the upper level portion A and the lower level portion B of the step. Thus, a resist pattern 2b having a line width of, for example, 130 nm is obtained. This resist pattern 2b having a line width of 130 nm has a rectangular section with favorable precision as compared with the resist pattern 12b having a line width of 110 nm in conventional example 1.

Figure 6E:
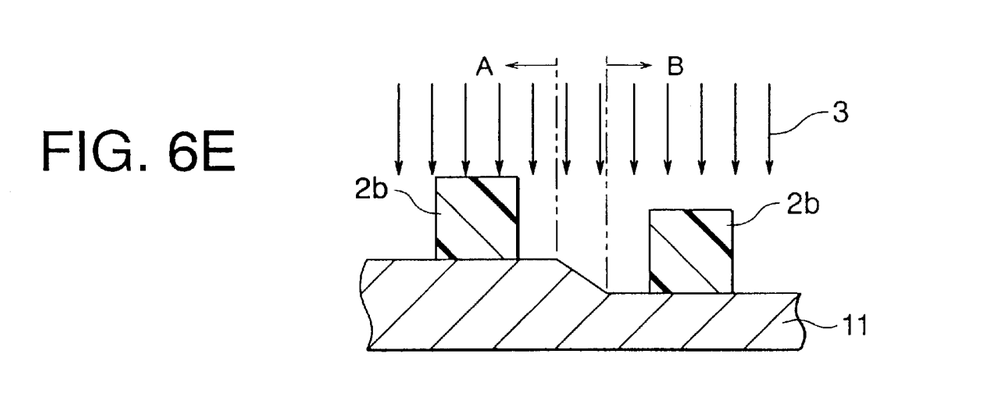

Subsequently, the resist pattern 2b is irradiated with, for example, KrF light 3 by the stepper (not shown) again to expose the whole surface (FIG. 6E). The exposure amount is, for example, 12.0 mJ/cm$^2$, which is equal to the amount for penetrating through the resist pattern or less. By this exposure, an acid generating agent is photodecomposed in the exposed portion of the resist pattern 2b, thereby generating an acid.

Figure 6F:
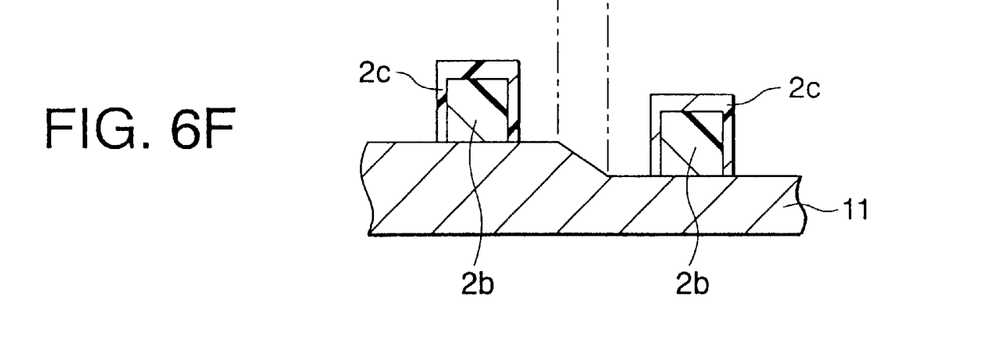

Subsequently, heat treatment is performed, for example, at 105° C. for 90 seconds (FIG. 6F). By this heat treatment, a protective group in the exposed portion of the resist pattern 2b is reacted by the acid catalyst elimination reaction in both the upper level portion A and the lower level portion B of the step, thereby increasing hydrophilicity of the exposed portion of the resist pattern 2b. As a result, a developer soluble portion 2c which can be dissolved by a developer is formed.

Figure 6G:
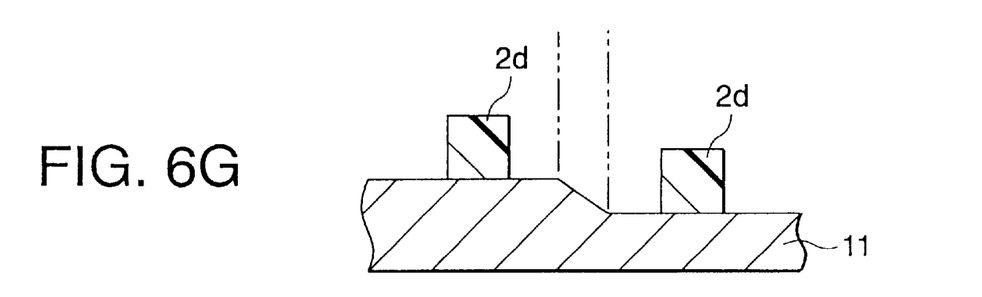

Then, development is performed with a TMAH aqueous solution having a concentration of, for example, 2.38%, for example, at a liquid temperature of 23° C. for a development time of 5 seconds (FIG. 6G). By this development, the developer soluble portion 2c is dissolved and removed and an unexposed portion remains in both the upper level portion A and the lower level portion B of the step. Thus, a resist pattern 2d having a line width of, for example, 110 nm is obtained. That is, the line width of the resist pattern 2b having a line width of 130 nm is reduced and a resist pattern 2d having a line width of 110 nm is obtained. This resist pattern 2d having a line width 110 nm has a rectangular section with favorable precision as compared with the resist pattern 12b having a line width of 110 nm in conventional example 1.

As described above, in this embodiment, the present invention is applied to a substrate having a step of 0.2 $\mu$m to form a resist pattern having a line width of 110 nm. Since a focal depth of about 0.3 $\mu$m is secured by the present invention, the resist pattern can be formed with high precision.

The above description focused on formation of a resist pattern to easily explain the object of the present invention. However, it is obvious that the original object is not formation of a resist pattern itself, but patterning such as wiring or the like by using the resist pattern. Therefore, in the above description, there is an expression such as a substrate under the resist, but it is needless to say that an interlayer insulating film or a conductor layer, which constitutes wiring, is formed immediately under the resist in an actual state.

According to the present invention, a pattern having a line width greater than a desired line width has only to be exposed in a process of exposing a pattern as described above. Therefore, a practical resolution can be ensured even when a desired line width is finer than a line width with which a sufficient focal depth is obtained. That is, a desired resist pattern having a line width finer than a line width with which a sufficient focal depth is obtained can be formed in high precision not only on a planar substrate, but also on a substrate with some irregularities.

In addition, since the whole surface is exposed with an exposure amount equal to the amount for penetrating through the resist pattern or less when a resist pattern having a line width greater than a desired line width is exposed, the whole resist pattern is not dissolved by the subsequent development. Therefore, too much reduction of the line width from the desired line width is prevented and thus a resist pattern having a desired line width can be easily and reliably formed.

Furthermore, according to the present invention, life of an aligner can be made longer since a resist pattern finer than the resolution limit of an existing aligner can be formed in favorable precision even on a semiconductor substrate with irregularities.

Furthermore, since a wiring pattern, a contact hole or the like can be formed in favorable precision irrespective of the position on the substrate even when an existing aligner is used, manufacturing yields and reliability of a semiconductor integrated circuit are improved.

What is claimed is:

1. A resist pattern forming method comprising the steps of:

forming a resist pattern by exposure and development; and reducing a line width of the resist pattern by photolithographically exposing the whole surface of said resist pattern and developing said resist pattern.

2. A resist pattern forming method comprising the steps of:

forming a resist pattern by exposure and development; and reducing a line width of said resist pattern by photolithographically exposing the whole surface of said resist pattern with an exposure amount equal to the amount for penetrating through said resist pattern or less and developing the resist pattern.

3. A resist pattern forming method comprising the steps of:

forming a resist pattern by exposure and development; and reducing a line width of said resist pattern by photolithographically exposing the whole surface of said resist pattern and developing the resist pattern for a development time shorter than a development time in the forming a resist pattern step.

4. A semiconductor device manufacturing method for forming a pattern having a desired width on a semiconductor surface, the method comprising the steps of:

coating the whole surface of the wafer with a resist;

performing exposure by using a mask pattern having a first width;

developing the resist to form a first pattern;

photolithographically exposing the whole surface of said first pattern and performing development to form a second pattern having a second width less than said first width; and processing material under the second pattern by using the second pattern.

5. The semiconductor device manufacturing method according to claim 4, wherein the semiconductor wafer has a step; and the first width is a width with which a sufficient focal depth can be obtained to form the first pattern irrespective of the position of exposure on the semiconductor wafer.

6. The semiconductor device manufacturing method according to claim 4, wherein the exposure amount for the exposure of the whole surface is an exposure amount equal to the amount for penetrating through said second pattern or less.

7. The semiconductor device manufacturing method according to claim 5, wherein the exposure amount for the exposure of the whole surface is an exposure amount equal to the amount for penetrating through said second pattern or less.

8. A resist pattern forming method comprising the steps of:

coating a substrate with a positive resist;

conducting a first exposure of a pattern to the resist with an exposure amount equal to the amount for penetrating through the resist pattern or more;

conducting a first heat treatment for making an exposed portion of the resist soluble;

conducting a first development for dissolving and removing the soluble portion of the resist to form a resist pattern;

conducting a second exposure for photolithographically exposing the whole surface of the resist pattern with an exposure amount equal to the amount for penetrating through the resist pattern or less;

conducting a second heat treatment for making the exposed portion of the resist pattern soluble; and conducting a second development for dissolving and removing the soluble portion of the resist pattern.

* * * * *